(12) United States Patent (10) Patent No.: US 9,716,197 B2
Kerzabi (45) Date of Patent: Jul. 25, 2017

(54) BACKLIT DISPLAY DEVICE WITH INTEGRATED PHOTOVOLTAIC CELLS

(71) Applicant: SUNPARTNER TECHNOLOGIES, Aix en Provence (FR)

(72) Inventor: Badre Kerzabi, Aix en Provence (FR)

(73) Assignee: SUNPARTNER TECHNOLOGIES, Aix en Provence (FR)

( * ) Notice: Subject to any disclaimer, the term of this patent is extended or adjusted under 35 U.S.C. 154(b) by 0 days.

(21) Appl. No.: 14/908,163

(22) PCT Filed: Jul. 28, 2014

(86) PCT No.: PCT/FR2014/000178
§ 371 (c)(1),
(2) Date: Jan. 28, 2016

(87) PCT Pub. No.: WO2015/015064
PCT Pub. Date: Feb. 5, 2015

(65) Prior Publication Data
US 2016/0211397 A1 Jul. 21, 2016

(30) Foreign Application Priority Data
Jul. 29, 2013 (FR) ..................................... 13 01822

(51) Int. Cl.
*H01L 31/0475* (2014.01)
*G02F 1/1335* (2006.01)
(Continued)

(52) U.S. Cl.
CPC .... *H01L 31/0475* (2014.12); *G02F 1/133526* (2013.01); *H01L 31/0236* (2013.01);
(Continued)

(58) Field of Classification Search
CPC . H01L 31/0475; H01L 31/0236; H01L 31/14; G02F 1/133526
See application file for complete search history.

(56) References Cited

U.S. PATENT DOCUMENTS 4,795,500 A 1/1989 Kishi et al.
7,206,044 B2 4/2007 Li et al.
(Continued)

FOREIGN PATENT DOCUMENTS

EP 1 174 756 A1 1/2002
WO WO 2009/052326 A2 4/2009
(Continued)

OTHER PUBLICATIONS

International Search Report (PCT/ISA/210) issued on Oct. 27, 2014, by the European Patent Office as the International Searching Authority for International Application No. PCT/FR2014/000178.
(Continued)

*Primary Examiner* — Paul Lee
(74) *Attorney, Agent, or Firm* — Buchanan Ingersoll & Rooney PC

(57) ABSTRACT

Process for manufacturing a photovoltaic module placed on an emissive display device, said photovoltaic module comprising an array containing a plurality of photovoltaic cells and a plurality of transparent zones called "orifices", and said photovoltaic module comprising an array of optical elements able to focus, by refraction or reflection, the light emitted by the device into the orifices.

14 Claims, 7 Drawing Sheets

Figure 1A:
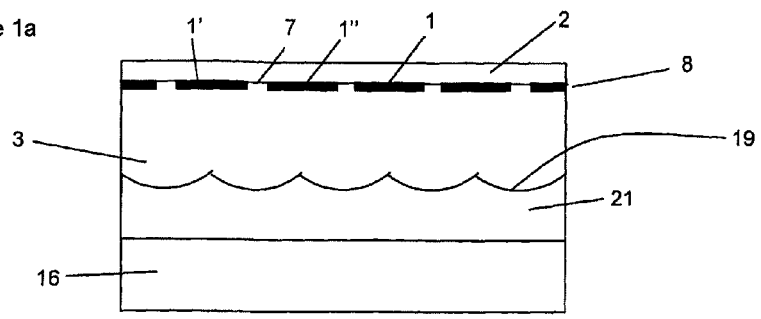

(51) Int. Cl.
  *H01L 31/042* (2014.01)
  *H01L 31/054* (2014.01)
  *H01L 31/0236* (2006.01)
  *H01L 31/14* (2006.01)
  *H01L 31/18* (2006.01)

(52) U.S. Cl.
  CPC ........ *H01L 31/042* (2013.01); *H01L 31/0543* (2014.12); *H01L 31/0547* (2014.12); *H01L 31/14* (2013.01); *H01L 31/18* (2013.01); *Y02E 10/50* (2013.01)

(56) References Cited

U.S. PATENT DOCUMENTS

| | | |
|---|---|---|
| 2002/0119592 A1 | 8/2002 | Oswald et al. |
| 2007/0102035 A1 | 5/2007 | Yang |
| 2010/0245731 A1 | 9/2010 | Limketkai et al. |
| 2010/0269885 A1* | 10/2010 | Benitez ............... H01L 31/0543 136/246 |
| 2010/0284055 A1 | 11/2010 | Kothari et al. |
| 2010/0289984 A1 | 11/2010 | Kishioka et al. |
| 2011/0063729 A1 | 3/2011 | Gilbert |
| 2011/0079267 A1* | 4/2011 | Raymond ............... F03G 6/067 136/246 |
| 2011/0094585 A1* | 4/2011 | Debije ................ C09K 19/588 136/257 |
| 2011/0109853 A1 | 5/2011 | Ge et al. |
| 2011/0168236 A1* | 7/2011 | Chan ..................... H01L 31/055 136/247 |
| 2012/0236540 A1 | 9/2012 | Gilbert et al. |

FOREIGN PATENT DOCUMENTS

| | | |
|---|---|---|
| WO | WO 2009/065069 A8 | 5/2009 |
| WO | WO2009/098459 A1 | 8/2009 |
| WO | WO 2012/104503 A1 | 8/2012 |
| WO | WO 2013/054010 A1 | 4/2013 |

OTHER PUBLICATIONS

Written Opinion (PCT/ISA/237) issued on Oct. 27, 2014, by the European Patent Office as the International Searching Authority for International Application No. PCT/FR2014/000178.

* cited by examiner

BACKLIT DISPLAY DEVICE WITH INTEGRATED PHOTOVOLTAIC CELLS

TECHNICAL FIELD OF THE INVENTION

The invention relates to the field of backlit display screens, and more particularly backlit display screens for portable electronic devices, such as telephones, exhibiting photovoltaic cells integrated into the display face.

PRIOR ART

Display screens comprising backlit image zones are commonly used in portable electronic devices.

Here, a "backlit" image zone is intended to mean an image zone which is situated in front of a light source which illuminates it from the rear. The "image zone" may for example be a pixel, a plurality of pixels or a part of a pixel (for example a liquid-crystal pixel), or else a strip of film on which an image has been printed. In a backlit screen, a diffuse light source is placed behind the plane of the pixels, in order to improve contrast.

Portable devices are generally powered by electric batteries, whose working lifetime is an important usage convenience factor. To increase this working lifetime, photocells have been integrated into these portable devices, which produce part of the current necessary for the operation of said device. Insofar as the space available for accommodating photocells on the external surface of said portable devices is very restricted, it would be desirable to integrate the photocells into the display screen.

The prior art shows a certain number of examples in respect of such integration. A first approach consists in depositing semi-transparent photovoltaic cells (see EP 1174 756 (ETA), U.S. Pat. No. 7,206,044 (Motorola), WO 2009/052326, US 2010/284055, WO 2009/065069 (Qualcomm), US 2010/245731 (Intel)).

Another approach consists in depositing photovoltaic layers in the form of strips between which the light originating from the pixels passes (see US 2002/0119592 (BP), U.S. Pat. No. 4,795,500 (Sanyo), WO 2009/098459 (M-Solv)). All these approaches lead to screens which are either dim, or the surface area of the photovoltaic cells, which is, for a given cell type, proportional to the energy converted, is small.

Document US 2007/0102035 (X. Yang) proposes a system with lenses which is disposed behind the display screen which focuses the backlighting light onto zones not covered with photocells, whilst photocells covering zones disposed on the surface of the screen collect the ambient diffuse light.

However, in general, these photocells must degrade neither the imaging characteristics nor the brightness of the screen into which they have been integrated, and this is why the total surface available for these photocells is in fact very restricted. Indeed, the width of the photocells cannot be significantly greater than the space between two pixels, a space that one wishes to minimize so as to improve the resolution of the screen. If the photocells are larger, and a fortiori when they partially cover the surface of the pixels as is the case in the embodiment discussed hereinabove of document US 2007/0102035, the brightness and the resolution of the image generated by the screen are degraded. This same document comprises another embodiment in which the backlighting light is focused in the space between the photocells by a lens situated between the backlighting light source and the substrate on which the array of pixels is situated. This embodiment exhibits the drawback of requiring extremely precise positioning of the lens, both as regards its lateral position, but especially its distance with respect to the photocells, which is detrimental to ready industrialization of this embodiment. Moreover, it does not make it possible to integrate the light source for backlighting directly into the substrate of the field-effect transistors which drive the liquid crystals forming the pixels of the screen.

Recently, these latter backlit screen systems furnished with strips of photocells integrated on the display face have been the starting point for a significant improvement through the use of lenticular arrays, such as is described in documents WO 2012/104503 and WO 2013/054010 (WYSIPS), which are capable of focusing the light originating from the pixels of the backlit screen between the strips and thus increase, for constant areal fraction of the photovoltaic strips, the brightness of the screen.

The fabrication of the lenticular arrays is carried out by deposition or by deformation of material on a substrate so as to accord it a structure in the form of strips which represent the shape of the lenses of the lenticular array. In the case of material deposition, the method employed is a casting of a liquid or semi-liquid polymer in a mold (typically made of polydimethylsiloxane), and then the solidification of the polymer is effected.

In the case of material deformation, the method is a stamping of the solid polymer with a mold. In the aforementioned two methods, the last step, which consists in demolding, is a tricky operation, since on account of the large surface of the undulations of the lenticular array, the polymer does not detach easily from the mold: there is a risk of breaking the lenticular array and/or its substrate. Moreover, the surface of the lenses of the lenticular array may be degraded during demolding and successive manipulations. And lastly, employing a mold makes it necessary either to treat the surface of the mold with a separating agent, or to use polymers which adhere as little as possible to glass, these polymers optionally being endowed with specific additives, which must not, however, degrade the optical transparency of the solidified polymer, and which must not accelerate the aging of the polymer.

The problem that the present invention wishes to solve is therefore that of presenting a simplified method of fabrication which avoids at least some of the aforementioned drawbacks, and which leads to an efficacious and durable product.

SUBJECTS OF THE INVENTION

According to the invention, the problem is solved by a novel method of fabricating a novel photovoltaic module, and by the integration of the latter into a display device with integrated photovoltaic cells, which represents a subject of the invention. This photovoltaic module comprises:
(a) an array of image zones emitting light or backlit by a light source placed behind the array of image zones;
(b) an array formed by a plurality of zones of photovoltaic cells and a plurality of orifices, in which array at least two neighboring zones of photovoltaic cells form an orifice,
(c) a lenticular array making it possible to focus the light emitted by said image zones in said orifices.

A first subject of the invention is a method of fabricating such a photovoltaic module, especially for a backlit display screen, said photovoltaic module comprising an array comprising a plurality of zones of photovoltaic cells and a plurality of free zones termed "orifices", and said photovoltaic module comprising a lenticular array able to focus the light in the orifices, in which method of fabrication:

a substrate is supplied, comprising an array exhibiting a plurality of zones of photovoltaic cells and a plurality of orifices;

a textured polarizer is supplied, comprising a textured surface composed of an array of crests and troughs which represent the negative shape of said array of optical elements, in such a way that the troughs of said array of optical elements are represented on said textured surface of said textured polarizer by crests and the crests of said array of optical elements are represented by troughs of the surface of the textured polarizer;

the textured face of said textured polarizer is fixed on the face of said substrate which comprises said photovoltaic cells, with the aid of a liquid or semi-liquid transparent polymer, the respective positioning of said textured polarizer and of said substrate being such that the crests or the troughs of said textured polarizer are approximately aligned with the center of said zones of photovoltaic cells or with the center of said orifices;

the crosslinking of said polymer is undertaken so as to obtain a bond between said textured polarizer and said substrate comprising zones of photovoltaic cells.

In one embodiment said array of photovoltaic cells is at least partially covered with an array of colored image zones.

The method according to the invention can comprise steps of fabricating said textured polarizer, namely the following steps:

a first polarizer is supplied, a liquid or semi-liquid polymer is deposited on one of its surfaces, the desired texture is imparted to this polymer so as to obtain said textured surface, for example with the aid of a textured pad or a roll, the crosslinking of said polymer is undertaken, knowing that said polymer, after crosslinking, must be optically transparent. Said polymer may be the same material as that of said first polarizer.

Alternatively, the method according to the invention can comprise the following steps for fabricating said textured polarizer:

a first polarizer is supplied, the desired texture is imparted to one of its surfaces so as to obtain said textured surface, for example with the aid of a textured pad or a roll.

Said polymer can be the same material as that of said first polarizer. Whether or not the material is the same, it is preferred that the optical index of said polymer be to within at least ±0.05 the same as that of the polarizer (and preferably to within at least ±0.03).

Said textured polarizer can be fabricated by a method in which a polarizer is supplied, the desired texture is imparted to one of its surfaces so as to obtain said textured surface, for example with the aid of a textured pad or a roll.

Alternatively, said textured polarizer can be fabricated by a method in which a first polarizer is supplied, a liquid or semi-liquid polymer is deposited on one of its surfaces, the desired texture is imparted to this polymer so as to obtain said textured surface, for example with the aid of a textured pad or a roll, the crosslinking of said polymer is undertaken, knowing that said polymer, after crosslinking, must be optically transparent.

This novel method of fabricating a photovoltaic module avoids the demolding of the lenticular array, even though the lenticular array is still fabricated by a molding method: according to the invention the mold is a component of the actual device, namely either the first polarizer or an optical layer in contact with the first polarizer.

Yet another subject according to the invention is a photovoltaic module with lenticular array able to be obtained by one of the methods according to the invention, characterized in that said photovoltaic cells are cells made of a thin layer of inorganic and/or organic materials, for example based on amorphous or microcrystalline silicon, based on CdTe or based on copper-indium-gallium-selenium or based on polymers.

Yet another subject of the invention is a display device with integrated photovoltaic cells and lenticular array, characterized in that it comprises, in order and following the direction of the emitted light:

a light source, such as a luminous plate;

in an optional manner, a collimation device, which can comprise a plurality of individual films;

a polarizer (referred to as the "second polarizer" here);

an electro-optical modulator, especially liquid-crystal based;

a polarizer (referred to as the "first polarizer" here);

a textured optical layer, which advantageously exhibits an optical index which is close (preferably to within at least ±0.05, and yet more preferentially to within at least ±0.03) or indeed identical to that of said first polarizer, knowing that this textured optical layer may be absent if it is the surface of said first polarizer itself which has been suitably textured with the undulations of the lenticular array so as to be able to act as mold for the fabrication of said lenticular array;

a lenticular array;

an array of colored image zones;

an array of zones of photovoltaic cells;

a substrate which protects said array of zones of photovoltaic cells, and on which said zones of photovoltaic cells may have been deposited during their fabrication.

Yet another subject of the invention is a display device with integrated photovoltaic cells and lenticular array, characterized in that it comprises, in order and following the direction of the emitted light:

a light source, such as a luminous plate;

optionally, a collimation device, which can comprise a plurality of individual films;

a polarizer termed the "second polarizer";

an electro-optical modulator, especially liquid-crystal based;

an array of colored image zones;

a polarizer termed the "first polarizer";

an optical layer textured with the undulations of the lenticular array, which advantageously exhibits an optical index which is close (preferably to within at least ±0.05, and more preferentially to within at least ±0.03) or indeed identical to that of said first polarizer with which it is in contact; knowing that this textured optical layer may be absent if it is the surface of the second polarizer itself which has been suitably textured with the undulations of the lenticular array so as to be able to act as mold for the fabrication of said lenticular array;

a lenticular array;

an array of zones of photovoltaic cells;

a substrate able to protect said array of zones of photovoltaic cells, and on which said zones of photovoltaic cells may have been deposited during their fabrication.

In a particular embodiment of said display devices according to the invention:

said zones of photovoltaic cells are parallel photovoltaic strips, said orifices are free strips, two neighboring photovoltaic strips delimiting a free strip;

said lenticular array comprises a juxtaposition of identical rectilinear lenses, whose longitudinal axis is parallel to the strips of the photovoltaic cells.

Said lenticular array can consist of a plurality of lenticular strips comprising cylindrical lenses or of a plurality of lenticular strips of hexagonal spherical lenses.

The device according to the invention can comprise a touchscreen on its external face, directed toward the user.

The display device according to the invention comprises an array of image zones. This may entail pixels. Here, the term "pixel" encompasses either an individual pixel corresponding to a colored filter of unique color, or a plurality of parts of a pixel corresponding to several colored filters (typically three, namely blue, red and green in color) which cooperate so as to create a luminous patch (typically perceived by the observer as a luminous dot) of a color determined as a function of the intensity emitted by each zone. These image zones or pixels form an ordered array. Pixel-based display techniques are known to a person skilled in the art. The screen according to the invention can be backlit by means of a light source placed behind the array of image zones or pixels (for example in the case of a screen of LCD (Liquid Crystal Display) type or in the case of an advertising panel comprising image zones in the form of printed parallel strips (preferably translucent). The screen can be a flexible or rigid screen. It can comprise on its external face a touch-sensitive layer or film, so as to allow the input of data by the user by way of a touch-sensitive pathway.

In other embodiments, the image zones, pixels and/or parts of pixels are ordered in such a way that various groups of image zones, pixels and/or parts of pixels generate different images.

The photovoltaic module according to the invention moreover comprises a plurality of zones (or strips) of PV cells (here the abbreviation "PV" signifies "photovoltaic") which alternate with a plurality of orifices (i.e. zones not comprising any photovoltaic cells, for example free strips) through which the light originating from the image zones or pixels can pass. Said zones of photovoltaic cells (for example said photovoltaic strips) and said orifices (for example said free strips) can have any length or width dimension; they can be spread over the whole of the length or width of the display device according to the invention, or over a part only; said display device can then comprise several sets of zones of photovoltaic cells. Said zones or strips of photovoltaic cells can be deposited on an appropriate substrate, for example a plate or a film; we subsequently refer to the zones or strips of photovoltaic cells deposited on their substrate as a "photovoltaic plate", which in no way implies that it is mechanically rigid. On the contrary, said substrate can be flexible, supple. Said zones of photovoltaic cells can have any shape, for example rectangular. Said zones of photovoltaic cells (for example said photovoltaic strips) and said orifices (for example said free strips) can be equidistant, or form otherwise an ordered array. By virtue of the orifices (for example the free strips), the photovoltaic plate is partially transparent; the so-called external optical transmission ($T_{ext}$) of the photovoltaic plate is determined in large part by the areal fraction that the photovoltaic cells occupy, and by their intrinsic optical transmission.

In all the embodiments, a zone or strip of photovoltaic cells can comprise one or more photovoltaic cells, and in the second case these photovoltaic cells can be of identical or different nature (materials and/or structure), shape and dimension, and they can be placed electrically in series and/or in parallel. Said zones of photovoltaic cells (for example said photovoltaic strips) are advantageously photovoltaic cells in the form of thin layers based on amorphous or microcrystalline silicon, since cells of this type are particularly suitable for converting light of low intensity (diffusing light, light inside rooms); but it is also possible to produce these photovoltaic cells with any other suitable technologies, for example based on CdTe or CIGS (copper-indium-gallium-selenium) or based on polymers. This may entail junctions of p-i-n or p-n type, or else tandem cells, i.e. comprising two overlaid cells which preferentially absorb a different part of the luminous spectrum. They can be designed to convert visible light and/or ultraviolet light and/or infrared light into electricity. They can be at least partially transparent to visible light. They can be protected by a protection layer, which is advantageously provided with an antireflection layer.

The display device according to the invention also comprises a plurality of lenses. These lenses can be identical or different.

In one embodiment, the primary lenticular array comprises a juxtaposition of identical rectilinear lenses, whose longitudinal axis is parallel to the strips of photovoltaic cells.

Advantageously, the respective surfaces of the photovoltaic array, of the lenticular array and of the array of pixels are either plane (and substantially parallel), or curved (while remaining equidistant), especially in the case where the screen is a flexible screen. The lenticular arrays can be made of an appropriate transparent plastic, such as PET.

In a general manner, the lenses forming the lenticular array can have any appropriate shape and appropriate characteristic; this may entail especially plano-convex or biconvex lenses, or else spherical and/or aspherical lenses, or else symmetric or asymmetric lenses, or else index-varying lenses.

More particularly, the array of image zones is advantageously positioned with respect to the lenticular array and with respect to the photovoltaic plate in such a way that the light originating from each image zone or part of image zone and received by the corresponding lens of the lenticular array is deviated and/or concentrated by this lens so as to pass entirely, or at least in large part, through one of the orifices of the photovoltaic plate.

FIGURES

Figure 1B:
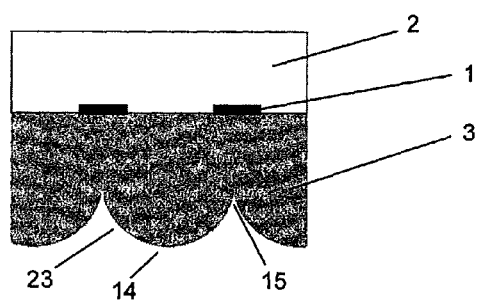

FIG. 1a schematically shows in transverse section the optical structure of a display screen with photovoltaic strips according to the prior art. FIG. 1b schematically shows in transverse section an extract of this device by focusing attention on the geometry of the substrate carrying the photovoltaic cells and on the geometry of the lenticular array.

FIGS. 2a, 2b, 2c, 2d, 2e, 2f and 2g schematically show in transverse section objects which illustrate different steps of a method according to the invention.

Figure 2A:
Figure 2B:
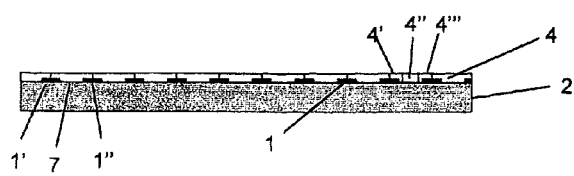
Figure 2C:
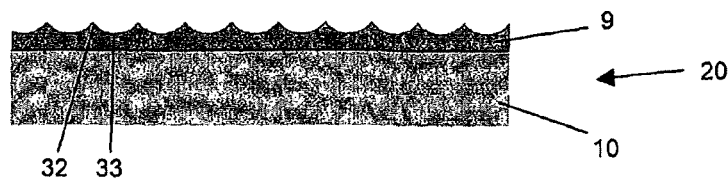
Figure 2D:
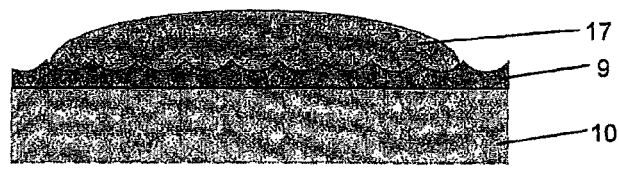
Figure 2E:
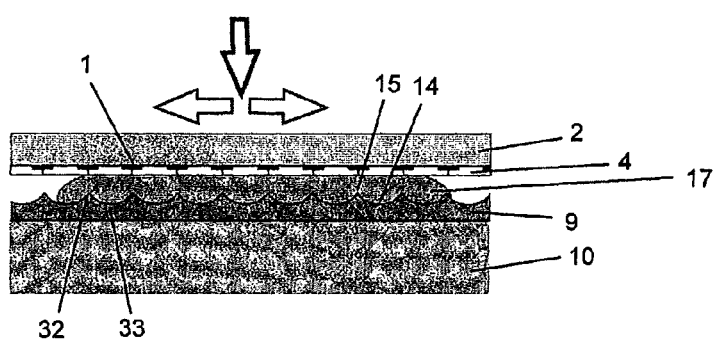
Figure 2F:
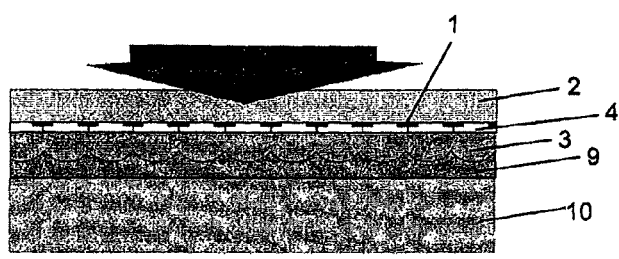
Figure 2G:
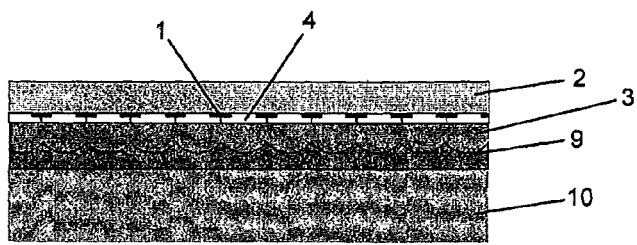
Figure 3:
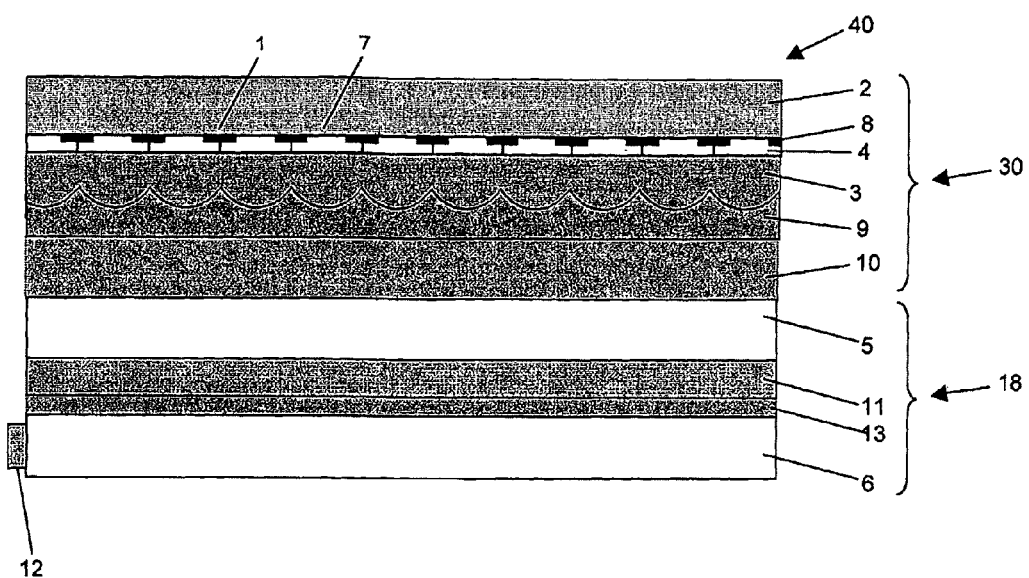

FIG. 3 schematically shows in transverse section a product according to the invention which can be fabricated by implementing the steps of the method illustrated in FIG. 2.

FIGS. 4a, 4b, 4c, 4d, 4e and 4f schematically show in transverse section objects which illustrate different steps of another method according to the invention.

Figure 5:
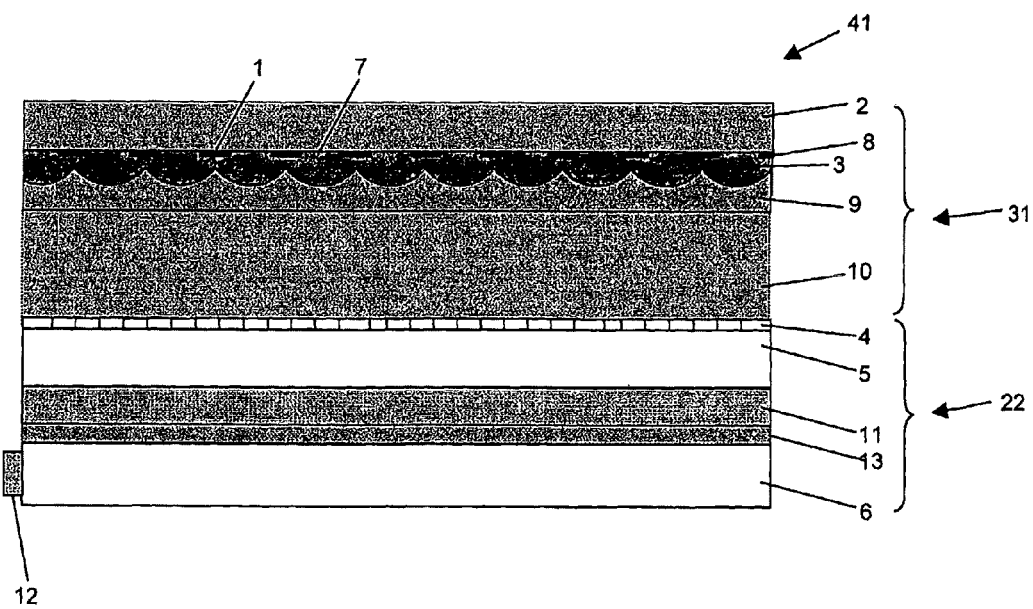

FIG. 5 schematically shows in transverse section a product according to the invention which can be fabricated by implementing the steps of the method illustrated in FIG. 4.

Figure 6A:
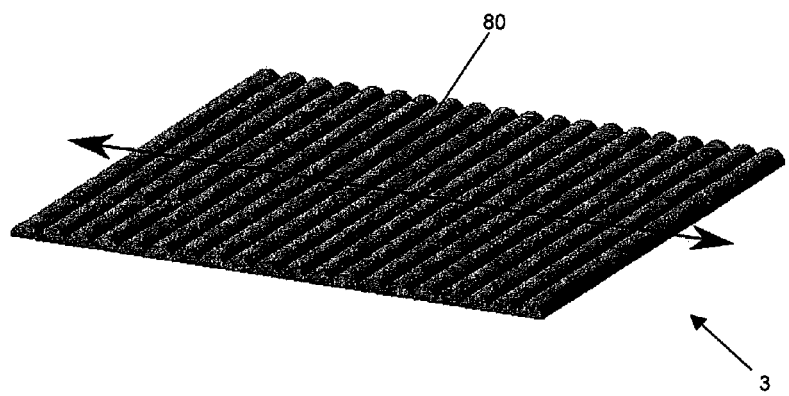
Figure 6B:
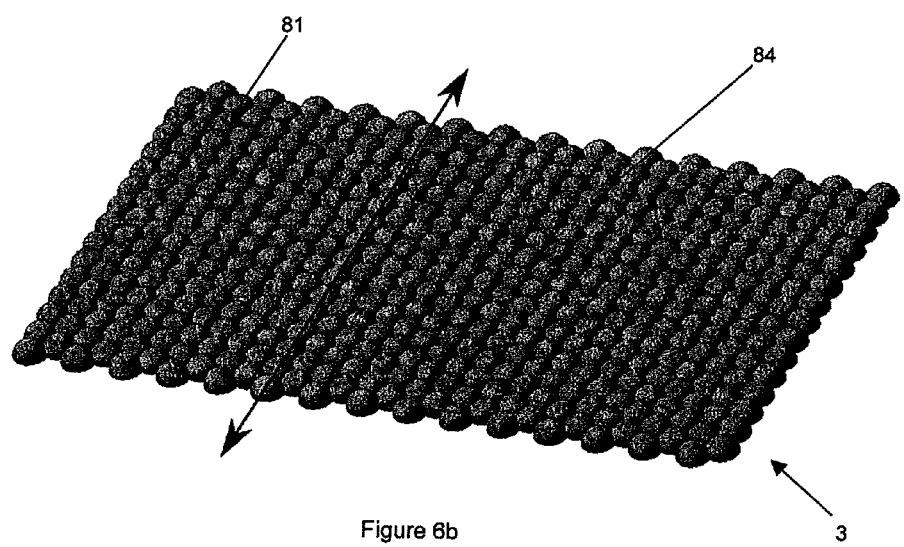
Figure 6C:

FIG. 6 shows a lenticular array composed of cylindrical lenses (FIG. 6a) or hexagonal spherical lenses (FIG. 6b), as well as the geometric parameters of these lenticular arrays seen in section (FIG. 6c).

Figure 7A:
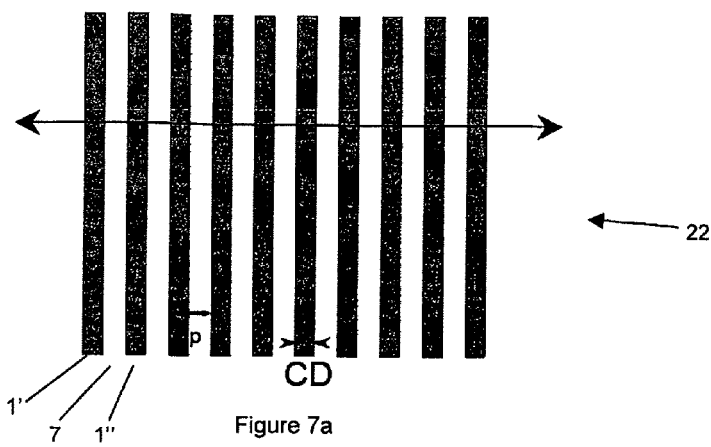
Figure 7B:
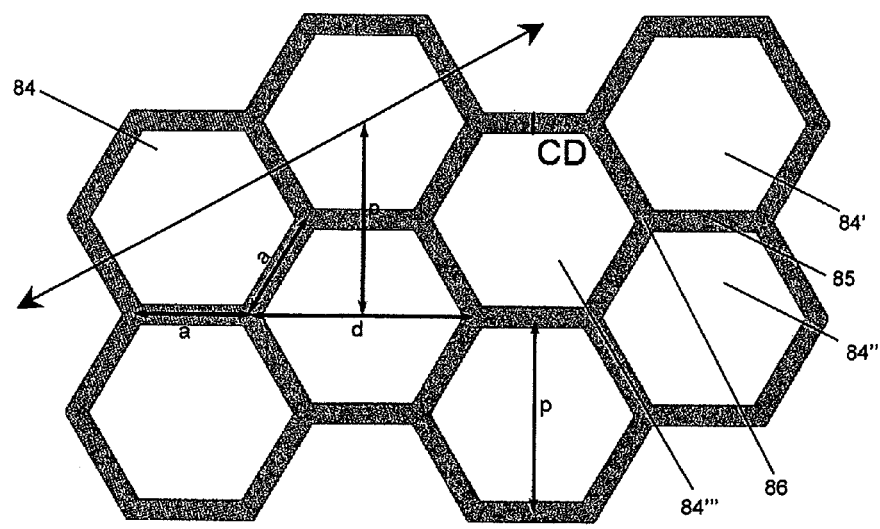
Figure 7C:
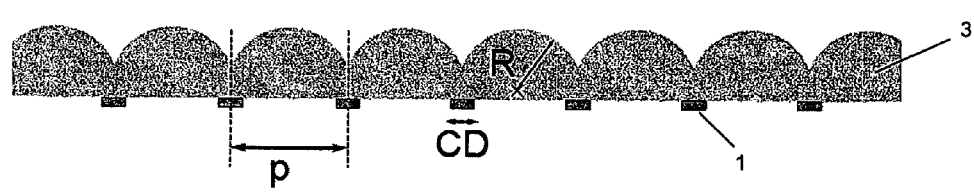

FIG. 7 defines geometric parameters of the zones of photovoltaic cells in the case where the zones of photovoltaic cells form an array of parallel strips two of whose neighboring strips delimit a free strip (FIG. 7a), in the case where the photovoltaic cells have the shape of strips each of which delimits two or (at the contact points) three hexagonal zones representing the orifices (FIG. 7b), and in the case where the photovoltaic cells are associated with the lenticular array (FIG. 7c).

Figure 8:
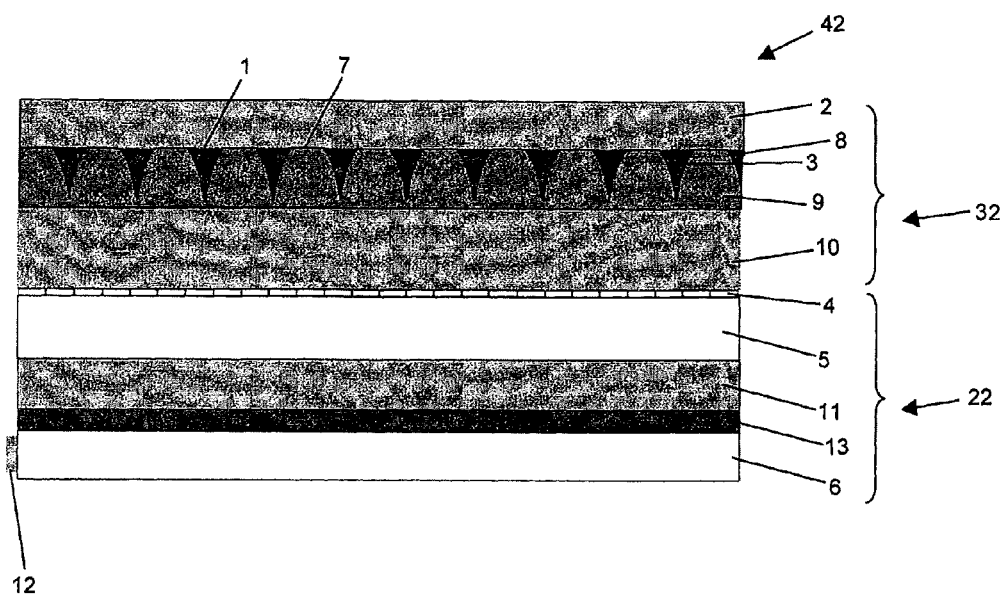

FIG. 8 schematically shows in transverse section a variant of the product according to the invention, described in FIG. 5.

DETAILED DESCRIPTION

FIG. 1a schematically shows a display screen of known type comprising a lenticular array 3 capable of focusing the light originating from a display device 16 in the space ("orifice") 7 between the photovoltaic strips 1',1". The latter are deposited on a substrate 2. The space 21 between the display device 16 and the surface of the lenses 19 of the lenticular array 3 can be an air space, or else be filled with an optically transparent glue.

FIG. 1b schematically shows in transverse section a part of the optical structure of a known screen. The photovoltaic cells 1, typically in the form of parallel strips, are deposited on a substrate 2, typically glass, and are sandwiched by the lenticular array 3. The latter comprises parallel undulations 23 comprising crests 14 and troughs 15, disposed parallel to the photovoltaic strips 1, in such a way that the crests 14 are situated in the middle between two photovoltaic strips 1, and the troughs 15 in the middle of the photovoltaic strips 1. Said undulations act as lenses.

FIG. 2 shows in a schematic manner a first method according to the invention for fabricating an essential part of a device according to the invention, namely a semi-transparent photovoltaic module with lenticular array.

A substrate 2 is supplied, on which has been deposited an array 8 formed by a plurality of zones of photovoltaic cells 1 and a plurality of orifices 7 (FIG. 2a), referred to as an "array 8 of photovoltaic cells 1". An array 4 of colored image zones is deposited above this array 8 of zones of photovoltaic cells 1 (FIG. 2b). This array 4 of colored image zones typically comprises three filters of different color 4', 4", 4'" for each pixel, namely a red filter, a blue filter and a green filter. Thus a first intermediate product is obtained.

Several deposition approaches and techniques can be employed to deposit the array 8 of photovoltaic cells 1 on the substrate 2; in particular the zones of photovoltaic cells 1 can be deposited by hiding the free zones (orifices) 7 with the aid of a mask, and/or it is possible to firstly deposit one or more large zone(s) of photovoltaic cell(s) and thereafter to clear the orifices 7 by an etching method.

In an independent manner, a first polarizer 10 is supplied, a polymer is deposited on said polarizer 10 and the texture desired for the lenticular array is imparted to this polymer, using any appropriate technique, for example a textured roll or a pad. This texture forms a lenticular surface. Said polymer can be deposited in the form of a liquid, solid or semi-solid layer, and it can be hardened after texturization by any technique appropriate to the polymer used (for example by thermal or photochemical effect).

By way of example, it is possible to deposit on said first polarizer 10 a partially molten plastic film, impart the desired texture to it, and then harden it by cooling it. Alternatively, it is possible to deposit on the first polarizer 10 a liquid or semi-liquid polymer with the aid of a textured roll and to harden this liquid or semi-liquid film. Thus is obtained a first polarizer 10 with a textured layer 9 whose lenticular surface exhibits the negative of the shape of the desired lenticular array (FIG. 2c). This shape in negative is characterized by the crests 32, which represent the troughs 15 of the lenticular array, and by troughs 33 which represent the crests 14 of the lenticular array, between which the shape of the surface of the individual lenses 19 extends.

Thus is obtained a second intermediate product that we refer to as a "textured polarizer" 20.

Said polymer which forms said textured layer 9 is advantageously the same material as that of said first polarizer 10, or a material exhibiting a very close or indeed identical optical index. Optical losses by internal reflection are thus avoided.

In a following step an optically transparent layer of polymer (glue) 17 with high refractive index is deposited on said textured layer 9 (FIG. 2d); this glue layer can be liquid or semi-liquid. Said first intermediate product is laid on said glue layer 17 and the respective positioning of the two components is adjusted if necessary. The positioning of the array 8 of zones of photovoltaic cells 1 with respect to the troughs 15 and crests 14 of the lenticular array 3 is indeed critical (FIG. 2e): in order for the lenses of the lenticular array 3 to be able to focus the light in the orifice 7 between two lenses 1',1", the troughs 15 of said lenticular array 3 must be centered on the zones of photovoltaic cells 1, and the crests 14 on the orifices 7. For this reason, the alignment of the textured polarizer 20 with respect to the substrate 2 must be such that the crests 32 of the textured polarizer 20 are centered on the zones of photovoltaic cells 1 and the troughs 33 on the orifices 7. After having positioned and aligned the two components correctly, the crosslinking of the glue 17 is undertaken, which thus forms the lenticular array; the textured layer 9 acts as mold for the lenticular array 3. As a function of the choice of the glue 17, said crosslinking can be done thermally or, preferably, photochemically (as in FIG. 2f), by choosing a photocrosslinkable glue 17. A third intermediate product (FIG. 2g) which exhibits a lenticular array 3 is thus obtained. We refer to this third intermediate product as a "PV module with lenticular array and array of colored image zones" 30.

In a variant (not illustrated in the figures) of this method, to fabricate the textured polarizer, a textured layer is not deposited on the first polarizer, but the material of the first polarizer is texturized directly, either by removal of material, or by deformation from a liquid, semi-liquid or solid state; it is then the textured surface of said first polarizer which acts as mold for the deposition of the lenticular array on the basis of said optically transparent polymer.

As shown in FIG. 3, said "PV module with lenticular array and array of colored image zones" 30 (i.e. the intermediate product obtained by the first method according to the invention) can be placed on a "display module without integrated colored filters" 18, which will be explained hereinbelow, to obtain a first product (display screen) 40 according to the invention. This display module without integrated colored filters 18 does not comprise the colored image zones, which are already integrated into the PV module 30 according to the invention.

FIG. 3 schematically shows said first product 40 according to the invention in transverse section. It comprises an electro-optical modulator 5, for example liquid-crystal based, which can be backlit by a light source 6 placed behind said electro-optical modulator 5. This light source may be a plate or film, which may be illuminated by one or more light-emitting diodes 12 as shown in FIG. 3, or otherwise.

The device 40 according to the invention moreover comprises an array 8 formed by a plurality of zones of photovoltaic cells 1 and a plurality of orifices 7, in which array at least two neighboring zones of photovoltaic cells 1', 1" form an orifice 7. This array 8 of zones of photovoltaic cells is deposited on the substrate 2. The device 40 moreover comprises a lenticular array 3 formed by a plurality of lenses capable of focusing, by refraction, the light emitted by said image zones in said orifices 7. The image zones 4 are situated between the lenticular array 3 and the array 8 of zones of photovoltaic cells 1. The polarizer 10, here referred to as the "first polarizer", in the form of a film or plate, is situated between the lenticular array 3 and the electro-optical modulator 5. Another polarizer 11, here referred to as the "second polarizer", also in the form of a film or plate, is situated between the light source 6 and the electro-optical modulator 5. In an advantageous embodiment, the light emitted by the light source 6 is collimated before illuminating the array of image zones 4. This collimation can be accomplished with the aid of a collimation device 13 which may be based on optical layers.

Thus, the optical structure of the first device 40 according to the invention comprises, in order and following the direction of the emitted light:
- a light source 6, for example a plate the light from which may originate for example from one or more light-emitting diodes 12, which can illuminate said plate in its edge face;
- optionally, a collimation device 13, which can comprise a plurality of individual films;
- a polarizer termed the "second polarizer" 11;
- an electro-optical modulator 5, especially liquid-crystal based;

(knowing that the assembly formed by said light source 6, said second polarizer 11 and said electro-optical modulator 5 (said collimation device 13 being able optionally to be added to said assembly, as indicated), is referred to here as the "display module without integrated colored filters" 18),
- a polarizer termed the "first polarizer" 10;
- a textured optical layer 9, which advantageously exhibits an optical index (preferably to within at least ±0.05, and yet more preferentially to within at least ±0.03) or indeed identical to that of the first polarizer 10 with which it is in contact; this textured optical layer 9 does not need to exercise another function in said device 40, its role is to act during the method of fabrication as mold for the fabrication of the lenticular array 3 on the basis of a liquid or semi-liquid polymer ("glue") 17, as described hereinabove; this textured optical layer 9 may be absent if it is the surface of said first polarizer 10 itself which has been suitably textured with the undulations of the lenticular array 3 so as to be able to act as mold for the fabrication of the lenticular array 3 as described hereinabove;
- a lenticular array 3;
- an array 4 of colored image zones 4', 4", 4'";
- an array of zones of photovoltaic cells 1;
- a substrate 2 which protects said array of zones of photovoltaic cells 1, and on which said zones of photovoltaic cells 1 may have been deposited during their fabrication.

FIG. 4 shows a second method for fabricating an essential part of a device according to the invention. This method uses as intermediate product the textured polarizer 20 of FIG. 2c, which is shown identically in FIG. 4b. As in the case of the first method, and by way of variant (not illustrated in the figures) of this method, it would also be possible to use a first polarizer 10 whose material has been textured instead of depositing a textured optical layer 9 to fabricate the textured polarizer 20; this texture of the first polarizer 10 can be obtained either by removal of material, or by deformation from a liquid, semi-liquid or solid state; it is then the textured surface of said first polarizer 10 which acts as mold for the deposition of the lenticular array 3 on the basis of said optically transparent polymer 17.

Figure 4A:
Figure 4B:
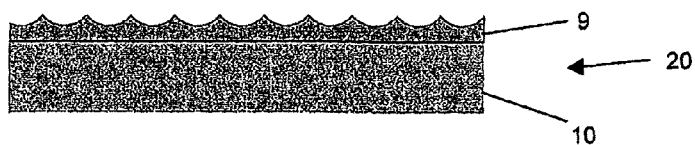
Figure 4C:
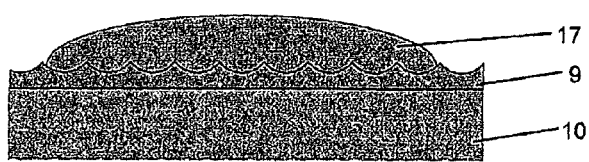
Figure 4D:
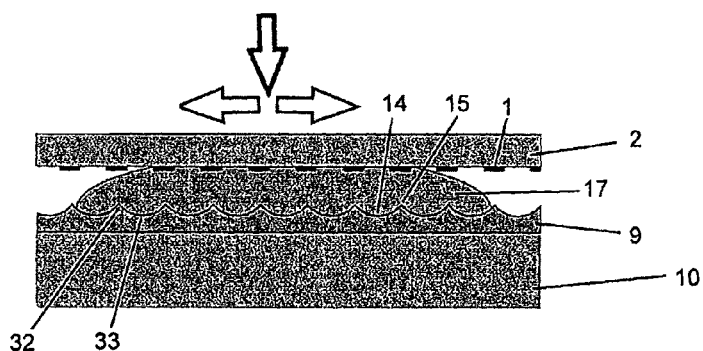
Figure 4E:
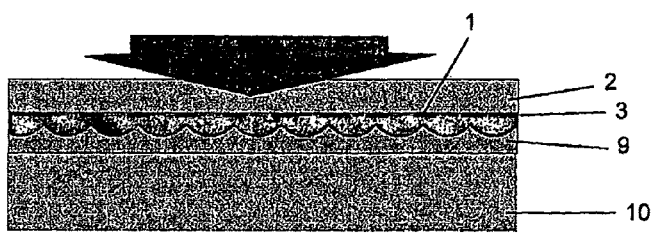
Figure 4F:
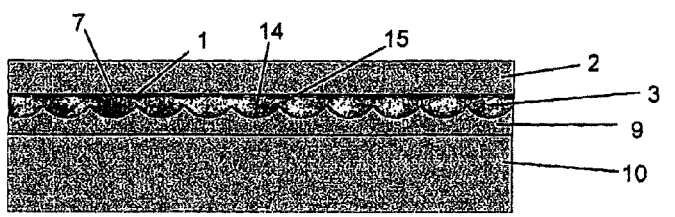

In this second method, a substrate 2 is supplied, on which an array of zones of photovoltaic cells 1 has been deposited (FIG. 4a). In an independent manner, said textured polarizer 20 is supplied. An optically transparent layer of polymer (glue) 17 with high refractive index is deposited on the textured surface of said textured polarizer 20 (FIG. 4c), this textured surface being either the textured face of the polarizer or the textured face of said textured layer 9.

Said substrate 2 with the array of zones of photovoltaic cells 1 is laid on said glue layer 17 and the respective positioning of the two components is adjusted if necessary. The positioning of the zones of photovoltaic cells 1 with respect to the troughs 15 and crests 14 of the lenticular array is indeed critical (FIG. 4d): in order for the lenses of the lenticular array 3 to be able to focus the light in the orifice 7 between two lenses 1',1", the troughs 15 of said lenticular array 3 must be centered on the zones of photovoltaic cells 1, and the crests 14 on the orifices 7. For this reason, the alignment of the textured polarizer 20 with respect to the substrate 2 must be such that the crests 32 of the textured polarizer 20 are centered on the zones of photovoltaic cells 1 and the troughs 33 on the orifices 7. After having positioned and aligned the two components correctly, the crosslinking of the glue 17 is undertaken, which thus forms the lenticular array 3; the textured layer 9 acts as mold for the lenticular array 3. As a function of the choice of the glue 17, said crosslinking can be done thermally or, preferably, photochemically (as in FIG. 4e), by choosing a photocrosslinkable glue 17. A fourth intermediate product is thus obtained (FIG. 4f), which exhibits a lenticular array 3. We refer to this fourth intermediate product as a "PV module with lenticular array without array of colored image zones" 31.

As shown in FIG. 5, said lenticular polarizer without color filters 31, obtained by the second method according to the invention, can be laid on a "display module with integrated colored filters" 22, which will be explained hereinbelow, to obtain a second product according to the invention, in such a way that the first polarizer 10 is situated downstream of said display device (the directional terms "upstream" and "downstream" refer to the direction of the light which goes from the light source toward the user of the device 41 situated downstream of the light source). If said display module with integrated colored filters 22 comprises an array 4 of colored filters, the latter is situated between the electro-optical modulator 5 and the first polarizer 10. This array 4 of colored image zones typically comprises three zones 4',4",4''' for each pixel, namely a red zone, a blue zone and a green zone.

FIG. 5 schematically shows a second display device 41 according to the invention in transverse section. It comprises an electro-optical modulator 5, especially liquid-crystal based, provided downstream with colored image zones 4',4",4''' backlit by a light source 6 placed upstream of said electro-optical modulator 5. This light source 6 may be a plate or film, which may be illuminated by one or more light-emitting diodes 12 as shown in FIG. 5, or otherwise.

This device 41 according to the invention moreover comprises an array 8 formed by a plurality of zones of photovoltaic cells 1 and a plurality of orifices 7, in which array at least two neighboring zones of photovoltaic cells 1',1" form an orifice 7. This array 8 of zones of photovoltaic cells is deposited on a substrate 2. The device 41 moreover comprises a lenticular array 3 formed by a plurality of lenses capable of focusing, by refraction, the light emitted by said image zones in said orifices 7. Said lenticular array 3 is in optical contact with the array 8 of zones of photovoltaic cells 1. The polarizer 10 in the form of a film or plate, referred to here as the "first polarizer", is situated between the lenticular array 3 and the image zones 4. Another polarizer 11, referred to here as the "second polarizer", also in the form of a film or plate, is situated between the light source 6 and the electro-optical modulator 5, and preferably in optical contact with the electro-optical modulator 5.

The term "optical contact" between two at least partially transparent media signifies here contact with no air gap, in such a way that the light beam which passes through the interface between the two media encounters only a single interface.

In an advantageous embodiment of this second embodiment, the light emitted by the light source 6 is collimated before illuminating the image zones 4. This collimation can be accomplished with the aid of a collimation device 13.

Thus, the optical structure of the device 41 according to the invention comprises, in order and following the direction of the emitted light:
- a light source 6, for example a plate the light from which may originate for example from one or more light-emitting diodes 12, which can illuminate said plate in its edge face;
- a collimation device 13, which can comprise a plurality of individual films;
- a polarizer termed the "second polarizer" 11;
- an electro-optical modulator 5;
- an array of colored image zones 4;
(knowing that the assembly formed by said light source 6, said second polarizer 11, said electro-optical modulator 5 and said array 4 of colored image zones (said collimation device 13 being able optionally to be added to said assembly, as indicated), is referred to here as the "display module with integrated colored filters" 22),
- a polarizer termed the "first polarizer" 10;
- an optical layer 9 textured with the undulations of the lenticular array 3; said layer 9 advantageously presents an optical index which is close or indeed identical to that of the first polarizer 10 with which it is in contact; this textured optical layer 9 does not need to exercise another function in said device 41, its role is to act during the method of fabrication as mold for the fabrication of the lenticular array 3 from a liquid or semi-liquid polymer ("glue") 17, as described hereinabove; this textured optical layer 9 may be absent if it is the surface of the first polarizer 10 itself which has been suitably textured with the undulations of the lenticular array so as to be able to act as mold for the fabrication of the lenticular array 3 as described hereinabove;
- a lenticular array 3;
- an array of zones of photovoltaic cells 1;
- a substrate 2 which protects said array of zones of photovoltaic cells 1, and on which said zones of photovoltaic cells 1 may have been deposited during their fabrication.

For the two products 30,31 according to the invention:
- The colored image zones 4',4",4''' emit or transmit a light of the desired color; this color may be generated especially by emission, by absorption or by interference, knowing that in a color display device, a pixel typically comprises three color zones (blue, red, green). Said colored image zones may be colored filters. They may also implement quantum dot technology, or any other appropriate technology.
- The substrate of the photovoltaic cells 2 may be made of glass, plastic or in any other transparent material; it may or may not be flat, for example bowed or curved, it may have any shape, especially rectangular, with or without rounded corners.
- The array of zones of photovoltaic cells 8 may comprise strips of photovoltaic cells. These latter may for example be parallel, and in this case the orifices 7 also have the shape of strips, referred to as "free strips"; they may be disposed otherwise than parallel, for example forming a hexagonal array.
- The lenticular array 3 is typically made of optically transparent plastic (polymer). It may consist of a juxtaposition of rectilinear or other lenses, identical or different, which may be of plano-convex or biconvex, or other type; they may be of symmetric or asymmetric, spherical or aspherical type. Advantageously, said lenticular array 3 generates an effect of individual lens for each pixel, focusing the light originating from the display module 18,22 in the orifice (free strip) 7 between two neighboring photovoltaic zones or strips 1',1". In a variant, each unit of color of the pixel (for example each colored image zone 4',4",4''') has its own lens. In the case where the zones of photovoltaic cells are strips 1, it is advantageous that the lenticular array 3 be composed of strips of lenses, these strips of lenses being parallel to the free strips in which they must focus the light originating from the display device 5.
- The first and second polarizers 10,11 may implement any appropriate technology, for example they may be oriented polymer films, or else films comprising grids (these grids being able to comprise parallel metallic wires and/or parallel strips deposited by a microlithographic or other method).
- The collimation device 13, which is optional, may comprise waveguide grids able to direct the light in a segment of space characterized by a narrow exit angle. It may be for example a film of CMOF (Collimating Multilayer Optical Film) type marketed by the company 3M. It may also be a waveguide device such as described in patent application WO 2005/107363 (Oy Modilis Ltd.), or a film with optical cavities such as that described in document WO 2011/127187 (Mobilis Holding LLC), comprising a plurality of optical cavities acting as waveguide; these cavities may in particular be prismatic cavities. Such collimation devices can be fabricated by rolling of a polymer film with a suitably textured roll which imparts the cavitied structure to the polymer film. Said polymer film may in particular be solid, liquid or semi-liquid; it may be covered with a protective film.

In all the embodiments of the invention, and as is shown in FIG. 6, said lenticular array 3 can consist of a plurality of lenticular strips 80 comprising cylindrical rectilinear lenses (FIG. 6a), or of a plurality of lenticular strips 81 of hexagonal spherical lenses 82 (FIG. 6b). The geometric parameters of the lenticular array 3 seen according to the two sectional planes delineated in FIGS. 6a and 6b are indicated in FIG. 6c.

FIG. 7 defines geometric parameters of the lenticular array according to two particular embodiments. FIG. 7a represents the surface of the array of photovoltaic cells in an embodiment where the zones of photovoltaic cells form an array of parallel strips 1 of width CD, two neighboring strips 1', 1" delimiting a free strip 7. FIG. 7b shows an embodiment with hexagonal orifices 84, and the photovoltaic cells 85 have the shape of strips of width CD forming a hexagonal array: each straight segment of a strip of photovoltaic cells delimits two neighboring hexagonal zones 84',84", or (at the contact points 86) three neighboring hexagonal zones 84', 84", 84'''; thus the array of photovoltaic strips 85 delimits the array of the orifices 84. FIG. 7c shows the array of photovoltaic cells 1 associated with the lenticular array 3 seen according to the two sectional planes delineated in FIGS. 7a and 7b. According to the device represented in FIG. 7c, p is advantageously between 5 µm and 100 µm and CD is advantageously between 0.1 p and 0.9 p. R is advantageously between 0.5 p and p in the embodiment of FIG. 7a, and between 0.57 p and p in the embodiment of FIG. 7b.

By way of example, devices have been produced according to the invention such as represented in FIG. 7a with p=50 µm, t=10 µm and with a radius of curvature R=26 µm. Devices have also been produced with p=30 µm, t=6 µm and R=16 µm, the parameter t being defined in FIG. 6c.

Devices have also been produced according to the invention such as represented in FIG. 7b with a=25 µm, d=50 µm, t=10 µm, h=43.3 µm and R=26 µm. Another example had the following parameters: a=15 µm, d=30 µm, t=6 µm, h=26 µm and R=16 µm, the parameter t being defined in FIG. 6c.

FIG. 8 schematically shows a third display device 42 according to the invention in transverse section. It comprises an electro-optical modulator 5, especially liquid-crystal based, provided downstream with colored image zones 4',4",4''' backlit by a light source 6 placed upstream of said electro-optical modulator 5. This light source 6 may be a plate or film, which may be illuminated by one or more light-emitting diodes 12 as shown in FIG. 8, or otherwise.

This device 42 according to the invention moreover comprises an array 8 formed by a plurality of zones of photovoltaic cells 1 and a plurality of orifices 7, in which array at least two neighboring zones of photovoltaic cells 1',1" form an orifice 7. This array 8 of zones of photovoltaic cells is deposited on a substrate 2. The device 42 moreover comprises an array of optical concentrators 3 which is formed by a plurality of parabolic concentrators capable of focusing, by reflection, the light emitted by said image zones 4 in said orifices 7. This reflection can take place at the interface between two optical media 3,9 of different refractive indices, or else on a reflecting surface, the optical concentrator 3 then being covered with a reflecting surface or composed wholly of a reflecting, for example metallic, material. FIG. 8 shows a concentrator of parabolic shape which is suitable for carrying out the present invention, but there exist numerous other shapes making it possible to concentrate by reflection the light emitted by the image zones 4.

Advantageously, to each optical concentrator there corresponds an individual colored image zone 4',4",4''' or a group of three image zones 4',4",4''' forming a pixel. Said array of optical concentrators 3 is in contact with the array 8 of zones of photovoltaic cells 1. The polarizer 10 in the form of a film or plate, referred to here as the "first polarizer", is situated between the array of optical concentrators 3 and the image zones 4. Another polarizer 11, referred to here as the "second polarizer", also in the form of a film or plate, is situated between the light source 6 and the electro-optical modulator 5, and preferably in optical contact with the electro-optical modulator 5.

The digital display screen 40,41,42 according to the invention can be incorporated in a fixed or portable electronic apparatus; this apparatus forms another subject of the invention. It may in particular be a mobile telephone, an electronic book, a portable television screen, a laptop computer screen. It may also be fixed apparatuses of more considerable size, for example a fixed television screen or advertising display screen. The digital display screen 40,41, 42 according to the invention can comprise a touch-sensitive coating or a film, so as to obtain a touchscreen.

In all the embodiments of the invention, the photovoltaic cells 1 can use any known and appropriate thin-layer technology. For screens intended for devices used indoors, it is preferable to use cells which have good conversion efficiency at low brightness (for example cells based on amorphous or microcrystalline silicon), since said cells will mainly capture diffusing light.

In all the embodiments of the invention, the display device 40,41,42 according to the invention can comprise other components which improve its characteristics or which tailor them to certain particular situations of use. By way of example, it may also comprise one or more of the following elements: a color filter, a polarizing filter, a lenticular element, a light diffuser, a protective layer, an antireflection layer. The display device 40,41,42 can also be a flexible screen.

In a general manner, the present description does not mention the positioning and the deposition of the electrical contacts and electrical connections to recover the electrical energy produced by the PV cells. A person skilled in the art will readily effect these connections by implementing his general technical knowledge.

ADVANTAGES OF THE INVENTION

The invention exhibits numerous advantages. It reduces the time required by the method of fabricating the PV module while enhancing the reliability of its quality. Indeed, one dispenses with the step of demolding the lenticular array, which is a step which exhibits a significant scrappage rate. One also dispenses with a step of gluing and optionally a step of surface treatment of the mold.

The display device 40 of the present invention moreover reduces the total thickness of the device, which is determined by the thickness of the glass sheets present in the device, with respect to the display devices according to the prior art. Indeed, in the display devices according to the prior art, the colored image zones are generally deposited on a specific substrate (typically a glass sheet). In the display device 40, this additional substrate is circumvented by depositing the colored image zones directly on the substrate of the PV array. In addition to the thickness, the proliferation of glass sheets in the device increases its retail cost, thin sheet glass being an expensive product. The invention therefore makes it possible to reduce the cost of fabrication of the display device 40.

LIST OF LABELS USED IN THE FIGURES

1 Zones of photovoltaic (PV) cells
2 Substrate of the PV cells
3 Lenticular array
4 Array of colored image zones
5 Electro-optical modulator
6 Light source (backlighting)
7 Orifice between zones of PV cells
8 Array of zones of PV cells
9 Textured optical layer
10 First polarizer
11 Second polarizer
12 Light-emitting diode
13 Collimation device
14 Crests of the lenticular array
15 Troughs of the lenticular array
16 Display device
17 Glue for lenticular array
18 Display module without integrated colored filters
19 Lens of the lenticular array
20 Textured polarizer
21 Space
22 Display module with integrated colored filters
23 Undulation
30 Semi-transparent PV module with lenticular array and array of colored image zones
31 Semi-transparent PV module with lenticular array without array of colored image zones
32 Crests of the textured polarizer
33 Troughs of the textured polarizer
40 Display device according to the invention
41 Display device according to the invention
80 Lenticular strip
81 Lenticular strip
82 Spherical hexagonal lens
84 Free strip (orifice)
85 Zone of photovoltaic cells
86 Triple point

The invention claimed is:

1. A method of fabricating a photovoltaic module disposed on an emissive display device, said photovoltaic module comprising an array having a plurality of zones of photovoltaic cells and a plurality of transparent zones termed "orifices", and said photovoltaic module comprising an array of optical elements able to focus, by refraction or by reflection, light emitted by the device in the orifices, said method comprising:
supplying a substrate, comprising an array having a plurality of zones of photovoltaic cells and a plurality of orifices;
supplying a textured polarizer, comprising a textured surface composed of an array of crests and of troughs which represent a negative shape of said array of optical elements, in such a way that troughs of said array of optical elements are represented on said textured surface of said textured polarizer by crests and crests of said array of optical elements are represented by troughs of the surface of the textured polarizer;
fixing the textured face of said textured polarizer on a face of said substrate which comprises said photovoltaic cells, with the aid of a liquid or semi-liquid transparent polymer, the respective positioning of said textured polarizer and of said substrate being such that the crests or the troughs of said textured polarizer are approximately aligned with the centers of said zones of photovoltaic cells or with the centers of said orifices; and
crosslinking of said polymer so as to obtain a bond between said textured polarizer and said substrate comprising zones of photovoltaic cells.

2. The method as claimed in claim 1, wherein said array of photovoltaic cells is at least partially covered with an array of colored zones.

3. The method as claimed in claim 1, wherein said textured polarizer is fabricated by:
supplying a first polarizer;
depositing a liquid or semi-liquid polymer on one surface of the first polarizer;
imparting a desired texture to this polymer so as to obtain said textured surface; and
crosslinking of said polymer so that said polymer, after crosslinking, is optically transparent.

4. The method as claimed in claim 3, wherein said polymer is the same material as that of said first polarizer.

5. The method as claimed in claim 1, wherein said textured polarizer is fabricated by:
supplying a first polarizer; and
imparting a desired texture to one surface of the first polarizer so as to obtain said textured surface.

6. A display device with integrated photovoltaic cells and light concentrators, comprising:
a light source;
a second polarizer;
an electro-optical modulator;
an array of colored image zones;
a first polarizer;
an array having a plurality of zones of photovoltaic cells and a plurality of transparent zones termed "orifices";
an array of optical concentrators able to focus, by reflections, the light in said orifices;
a textured optical layer in contact with the first polarizer, which has an optical index within +0.05 of the optical index of the first polarizer;
a substrate which protects said array of zones of photovoltaic cells, and on which said zones of photovoltaic cells are disposed.

7. The display device as claimed in claim 6, wherein the array of colored image zones is placed between (i) the electro-optical modulator and the first polarizer, or (ii) the array of zones of photovoltaic cells and the array of optical concentrators.

8. The display device as claimed in claim 6, wherein said optical concentrators comprise one or more plane, concave or convex surfaces, and parabolic, conical, pyramidal, tetrahedral, semi-cylindrical or cylindro-parabolic shapes.

9. A fixed or portable electronic apparatus, comprising a display device as claimed in claim 6.

10. The display device of claim 6, further including a collimation device comprising a plurality of individual films.

11. The display device of claim 6, wherein the optical index of said textured optical layer is within +0.03 of the optical index of said first polarizer.

12. The display device of claim 11, wherein the optical index of said textured optical layer is identical to that of said first polarizer.

13. The display device of claim 6, wherein the textured optical layer is formed by the surface of the first polarizer itself which has been textured with crests and troughs of the array of optical concentrators.

14. The method of claim 5, wherein the desired texture is imparted by means of a textured pad or roller.

* * * * *